(12) United States Patent
Wagatsuma et al.

(10) Patent No.: US 12,482,695 B2
(45) Date of Patent: Nov. 25, 2025

(54) SUBSTRATE TREATMENT METHOD AND SUBSTRATE TREATMENT DEVICE

(71) Applicant: TOKYO ELECTRON LIMITED, Tokyo (JP)

(72) Inventors: Yuichiro Wagatsuma, Nirasaki (JP); Masahisa Watanabe, Nirasaki (JP); Mayuko Nakamura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 267 days.

(21) Appl. No.: 18/032,544

(22) PCT Filed: Oct. 8, 2021

(86) PCT No.: PCT/JP2021/037297
§ 371 (c)(1),
(2) Date: Apr. 18, 2023

(87) PCT Pub. No.: WO2022/085484
PCT Pub. Date: Apr. 28, 2022

(65) Prior Publication Data
US 2023/0392261 A1   Dec. 7, 2023

(30) Foreign Application Priority Data
Oct. 19, 2020   (JP) ................ 2020-175453

(51) Int. Cl.
*H01L 21/687* (2006.01)
*C23C 16/455* (2006.01)
(Continued)

(52) U.S. Cl.
CPC .. *H01L 21/68742* (2013.01); *C23C 16/45536* (2013.01); *C23C 16/45565* (2013.01);
(Continued)

(58) Field of Classification Search
CPC ......... H01L 21/68742; H01L 21/67103; H01L 21/68771; H01L 21/67109; H01L 21/67248; H01L 21/68764; H01L 21/68792; C23C 16/45536; C23C 16/45565; C23C 16/4584; C23C 16/4586; C23C 16/46; C23C 16/505; C23C 16/52; C23C 16/56; C23C 16/45551
See application file for complete search history.

(56) References Cited

U.S. PATENT DOCUMENTS

2015/0200110 A1*  7/2015  Li .................. C23C 16/45551
                                                    438/696
2017/0330787 A1*  11/2017  Mitsunaga .......... C23C 16/4584

FOREIGN PATENT DOCUMENTS

EP      2498277 A1    9/2012
JP      2017-208374 A  11/2017

* cited by examiner

*Primary Examiner* — Michael G Miller
(74) *Attorney, Agent, or Firm* — Nath, Goldberg & Meyer; Jerald L. Meyer

(57) ABSTRACT

A substrate treatment method of a substrate treatment device, which includes a stage on which a substrate is mounted, a heating element provided on the stage, and a rotation mechanism that rotates the stage, includes: mounting the substrate on the stage; and performing a process on the substrate, wherein the performing the process on the substrate has a plurality of steps, and wherein each of the plurality of steps includes controlling the heating element and controlling the rotation mechanism.

12 Claims, 17 Drawing Sheets

(51) Int. Cl.
*C23C 16/458* (2006.01)
*C23C 16/46* (2006.01)
*C23C 16/505* (2006.01)
*C23C 16/52* (2006.01)
*C23C 16/56* (2006.01)

(52) U.S. Cl.
CPC ...... *C23C 16/4584* (2013.01); *C23C 16/4586* (2013.01); *C23C 16/46* (2013.01); *C23C 16/505* (2013.01); *C23C 16/52* (2013.01); *C23C 16/56* (2013.01)

FIG. 3

|  | Prof. 1 | Prof. 2 |
|---|---|---|
| First region (101) |  |  |
| Second region (102) |  |  |
| Third region (103) | High temperature | Low temperature |
| Fourth region (104) | High temperature | Low temperature |
| Fifth region (105) | Low temperature | High temperature |
| Sixth region (106) | Low temperature | High temperature |

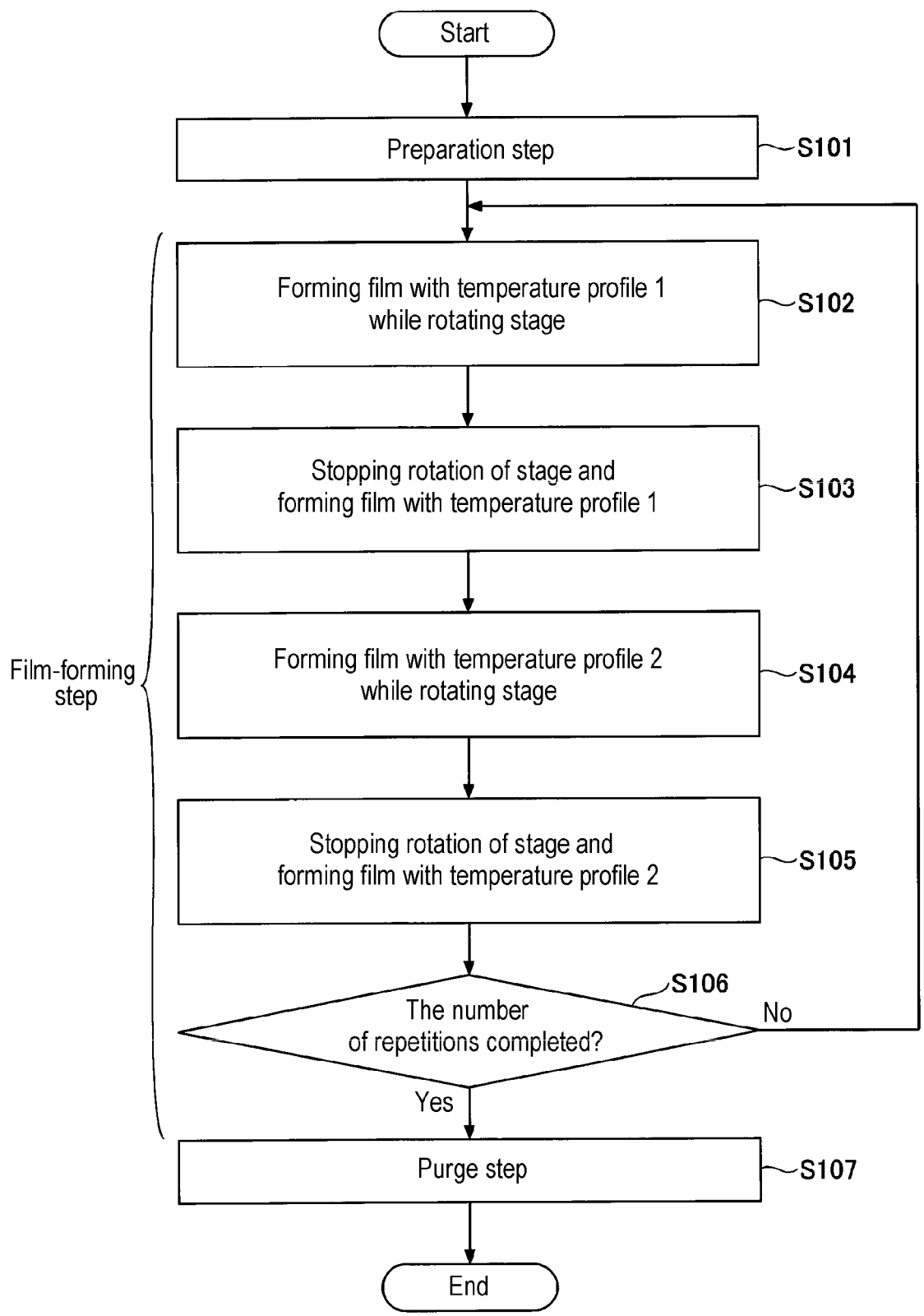

FIG. 6

| | Prof. 1 | Prof. 2 | Prof. 3 | Prof. 4 | Prof. 5 |
|---|---|---|---|---|---|
| First region (101) | 1.05 | 1.05 | 1.05 | 0.95 | 0.95 |
| Second region (102) | 1.07 | 1.07 | 1.07 | 0.95 | 0.95 |
| Third region (103) | 1.20 | 0.80 | 1.00 | 1.10 | 0.80 |
| Fourth region (104) | 1.15 | 0.75 | 1.00 | 1.15 | 0.75 |
| Fifth region (105) | 0.80 | 1.20 | 1.00 | 0.80 | 1.20 |
| Sixth region (106) | 0.75 | 1.15 | 1.00 | 0.75 | 1.15 |

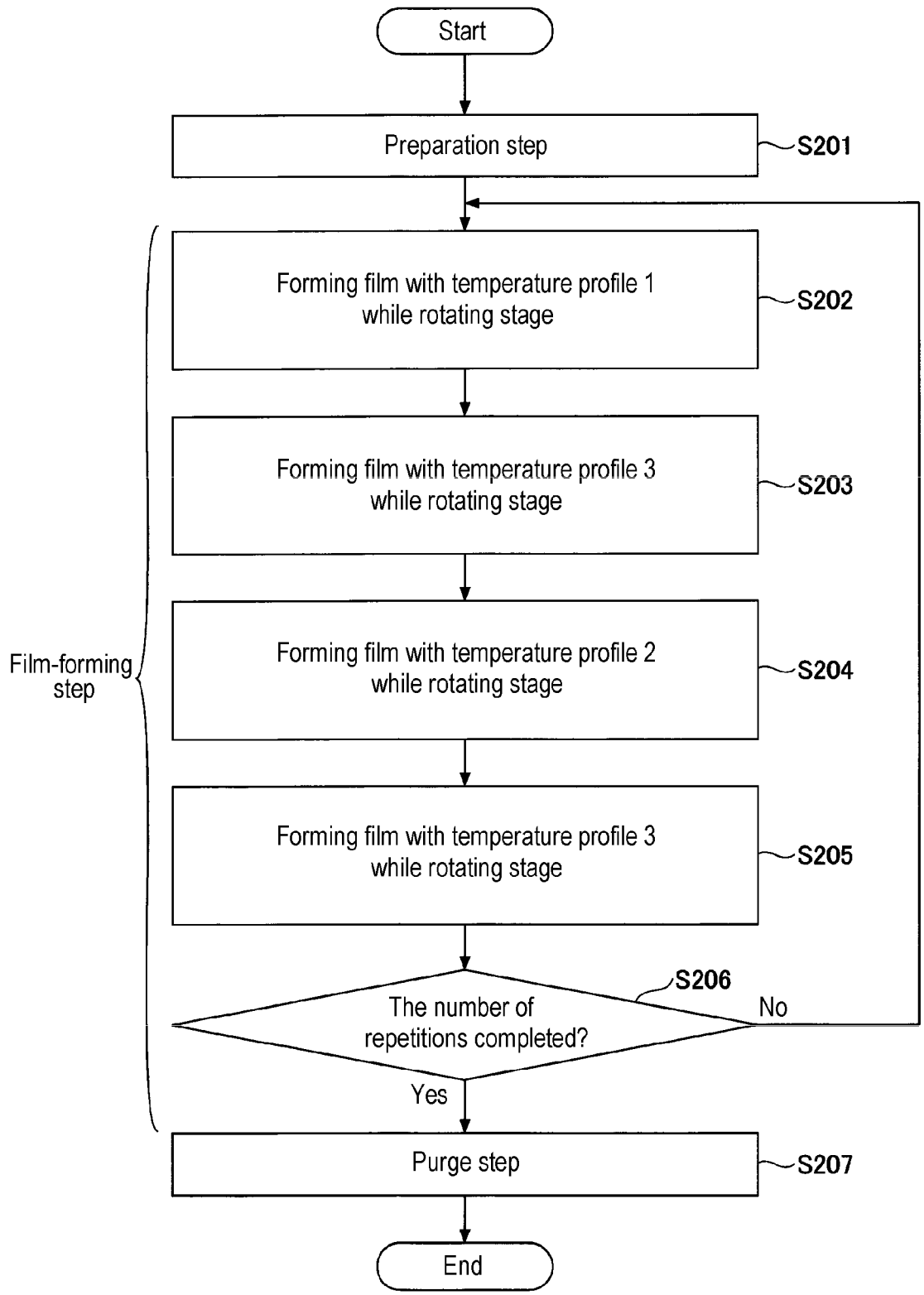

FIG. 13

| | Prof. 1 | Prof. 2 | Prof. 3 | Prof. 4 | Prof. 5 |
|---|---|---|---|---|---|
| First region (101) | 1.00 | 1.00 | 1.00 | 1.00 | 1.00 |
| Second region (102) | 1.65 | 1.65 | 1.65 | 1.65 | 1.65 |
| Third region (103) | 0.81 | 0.82 | 0.79 | 0.77 | 0.80 |
| Fourth region (104) | 0.82 | 0.79 | 0.77 | 0.81 | 0.80 |
| Fifth region (105) | 0.79 | 0.77 | 0.81 | 0.82 | 0.80 |
| Sixth region (106) | 0.77 | 0.81 | 0.82 | 0.79 | 0.80 |

Exhaust direction
Notch direction

SUBSTRATE TREATMENT METHOD AND SUBSTRATE TREATMENT DEVICE

This is a National Phase Application filed under 35 U.S.C. 371 as a national stage of PCT/JP2021/037297, filed Oct. 8, 2021, an application claiming the benefit of Japanese Application No. 2020-175453, filed Oct. 19, 2020, the content of each of which is hereby incorporated by reference in its entirety.

TECHNICAL FIELD

The present disclosure relates to a substrate treatment method and a substrate treatment device.

BACKGROUND

A substrate treatment device for supplying a process gas into a process container and performing a desired process (for example, a film forming process, an etching process, etc.) on a substrate is known.

Patent Document 1 discloses a stage system including a rotatable stage on which a substrate is mounted, a plurality of heaters that is provided on the stage and heats the stage, one power supply that supplies power to the plurality of heaters, and a power switching part that switches a heater to which power is supplied from the power supply to one of the plurality of heaters according to a rotation angle of the stage.

PRIOR ART DOCUMENTS

Patent Documents

Patent Document 1: Japanese Laid-Open Publication No. 2017-208374

By the way, when the substrate is processed, in-plane uniformity of the substrate processing may be degraded depending on the internal environment of the process container.

In one embodiment, the present disclosure provides a substrate treatment method and a substrate treatment device for improving the in-plane uniformity in substrate processing.

SUMMARY

According to one embodiment of the present disclosure, a substrate treatment method of a substrate treatment device which includes a stage on which a substrate is mounted, a heating element provided on the stage, and a rotation mechanism that rotates the stage, the method including: mounting the substrate on the stage; and performing a process on the substrate, wherein the performing the process on the substrate has a plurality of steps, and wherein each of the plurality of steps includes controlling the heating element and controlling the rotation mechanism.

According to one embodiment of the present disclosure, it is possible to provide a substrate treatment method and a substrate treatment device for improving in-plane uniformity in substrate processing.

BRIEF DESCRIPTION OF DRAWINGS

FIG. 3 is a diagram showing an example of a temperature profile table of a heater stored in a controller.

FIG. 4 is a flowchart showing a first operation example in the substrate treatment device.

FIG. 6 is a diagram showing another example of the temperature profile table of the heater stored in the controller.

FIG. 7 is a flowchart showing a second operation example in the substrate treatment device.

FIG. 13 is a diagram showing still another example of the temperature profile table of the heater stored in the controller.

DETAILED DESCRIPTION

Figure 1:
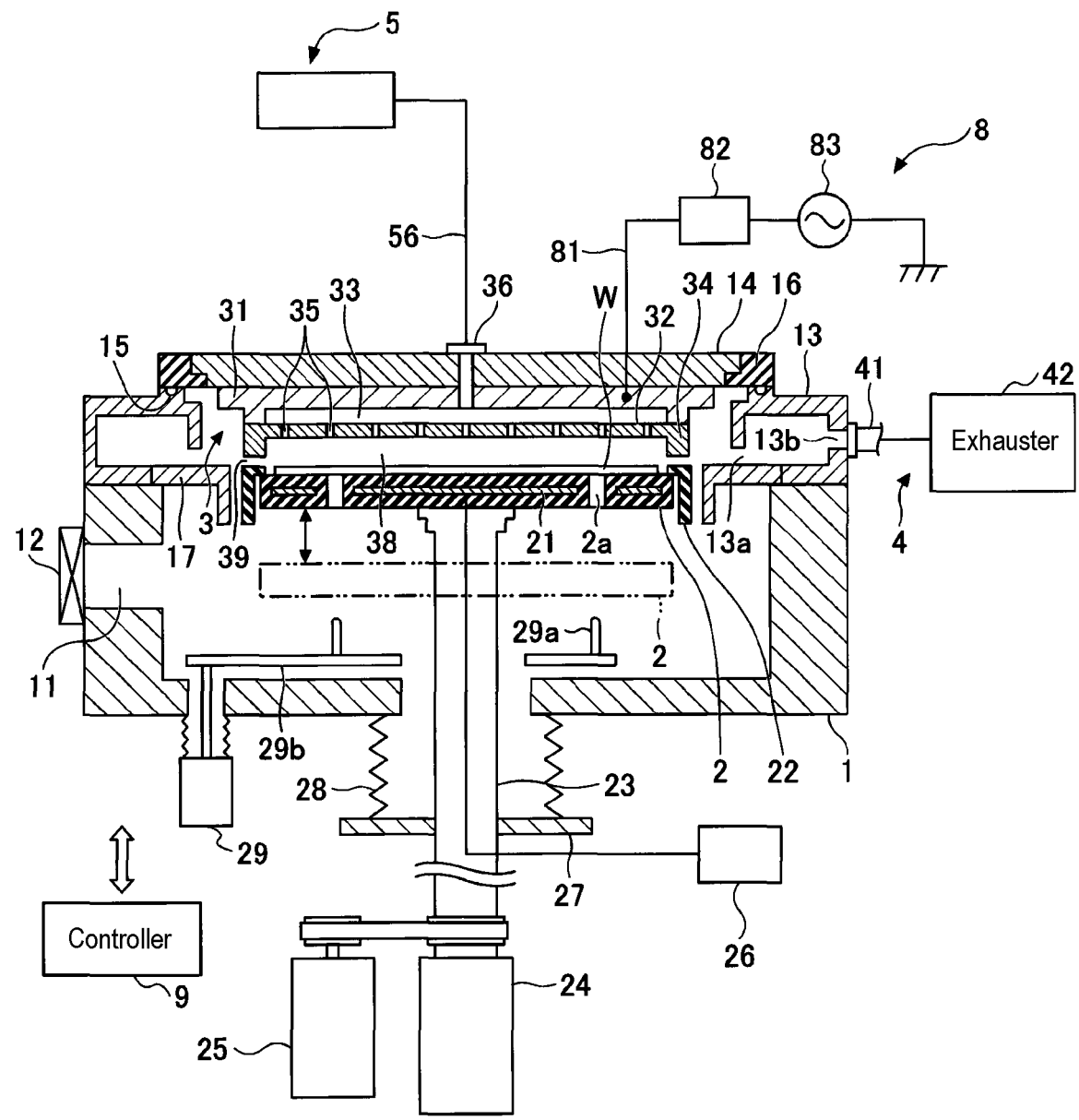
FIG. 1 is an example of a schematic view showing a configuration example of a substrate treatment device.

Embodiments for carrying out the present disclosure will now be described with reference to the drawings. Throughout the drawings, the same components are denoted by the same reference numerals, and explanation thereof may not be repeated.

Substrate Treatment Device

A substrate treatment device according to an embodiment will be described with reference to FIG. 1. FIG. 1 is an example of a schematic view showing a configuration example of a substrate treatment device.

As shown in FIG. 1, the substrate treatment device includes a process container 1, a stage 2, a shower head 3, an exhaust part 4, a gas supply mechanism 5, an RF power supplier 8, and a controller 9.

The process container 1 is made of metal such as aluminum and has a substantially cylindrical shape. The process container 1 accommodates a substrate W therein. A loading/unloading port 11 for loading or unloading the substrate W is formed in a sidewall of the process container 1, and the loading/unloading port 11 is opened/closed by a gate valve 12. An annular exhaust duct 13 having a rectangular cross section is provided on a main body of the process container 1. A slit 13a is formed along the inner peripheral surface of the exhaust duct 13. An exhaust port 13b is formed in an outer wall of the exhaust duct 13. A ceiling wall 14 is provided on the upper surface of the exhaust duct 13 so as to close an upper opening of the process container 1 via an insulator member 16. A space between the exhaust duct 13 and the insulator member 16 is air-tightly sealed with a seal ring 15. A partitioning member 17 partitions the interior of the process container 1 into an upper portion and a lower portion when the stage 2 (and a cover member 22) is raised to a processing position to be described later.

The stage 2 supports the substrate W in a horizontal posture within the process container 1. The stage 2 is formed in a disk shape having a size corresponding to the substrate W and is supported by a support member 23. The stage 2 is made of a ceramic material such as AlN, or a metal material such as aluminum or nickel alloy, and a heater 21 for heating the substrate W is buried in the stage 2. The heater 21 is supplied with power by a heater power supply (not shown) to generate heat. Then, by controlling the output of the heater 21 according to a temperature signal from a thermocouple (not shown) provided near the upper surface of the stage 2, the substrate W is controlled to a predetermined temperature. The stage 2 is provided with the cover member 22 made of ceramics such as alumina so as to cover the outer peripheral region of the upper surface and the side surfaces thereof.

The support member 23 for supporting the stage 2 is provided on the bottom surface of the stage 2. The support member 23 extends below the process container 1 through a hole portion formed in the bottom wall of the process container 1 from the center of the bottom surface of the stage 2, and its lower end is connected to an elevating mechanism 24. The stage 2 is raised/lowered by the elevating mechanism 24 via the support member 23 between the processing position shown in FIG. 1 and a transfer position indicated by a two-dot chain line below the processing position, where the substrate W can be transferred. Further, a flange portion 27 is provided on the support member 23 below the bottom surface of the process container 1. A bellows 28 is provided between the bottom surface of the process container 1 and the flange portion 27 to separate the internal atmosphere of the process container 1 from the outside air and expand/contract as the stage 2 is raised/lowered.

A rotation mechanism 25 rotates the support member 23 and the stage 2 with the central axis of the supporting member 23 and the stage 2 as a rotation axis.

A heater power supply 26 supplies power to the heater 21. The heater 21 and the heater power supply 26 are connected via, for example, a slip ring (not shown). Further, the heater 21 is divided into a plurality of regions (see FIG. 2 described later). The heater power supply 26 controls the supply of power for each region of the heater 21 (see FIG. 2 described later).

Three wafer support pins 29a (only two are shown) are provided in the vicinity of the bottom surface of the process container 1 so as to protrude upward from an elevating plate 29b. The wafer support pins 29a are lifted up/down via the elevating plate 29b by an elevating mechanism 29 provided below the process container 1. The wafer support pins 29a are inserted into through-holes 2a provided in the stage 2 at the transfer position so as to be able to protrude/retract from the upper surface of the stage 2. The substrate W is delivered between a transfer mechanism (not shown) and the stage 2 by lifting up/down the wafer support pins 29a.

The shower head 3 supplies a process gas into the process container 1 in the form of a shower. The shower head 3 is made of metal, is provided so as to face the stage 2, and has approximately the same diameter as the stage 2. The shower head 3 has a body portion 31 fixed to the ceiling wall 14 of the process container 1 and a shower plate 32 connected to the bottom of the body portion 31. A gas diffusion space 33 is formed between the body portion 31 and the shower plate 32, and a gas introduction hole 36 is provided in the gas diffusion space 33 so as to penetrate the centers of the ceiling wall 14 and the body portion 31 of the process container 1. An annular protrusion 34 protruding downward is formed on the periphery of the shower plate 32. Gas discharge holes 35 are formed in the inner flat surface of the annular protrusion 34. When the stage 2 is placed at the processing position, a processing space 38 is formed between the stage 2 and the shower plate 32, and the upper surface of the cover member 22 and the annular protrusion 34 are in close proximity to form an annular gap 39.

The exhaust part 4 exhausts the interior of the process container 1. The exhaust part 4 has an exhaust pipe 41 connected to the exhaust port 13b, and an exhaust mechanism 42 connected to the exhaust pipe 41 and having a vacuum pump, a pressure control valve, and the like. During processing, a gas in the process container 1 reaches the exhaust duct 13 through the slit 13a and is exhausted by the exhaust mechanism 42 from the exhaust duct 13 through the exhaust pipe 41.

The gas supply mechanism 5 supplies the process gas into the process container 1. The gas supply mechanism 5 is connected to the gas introduction hole 36 via a gas supply line 56.

The substrate treatment device is a capacitively coupled plasma apparatus, in which the stage 2 serves as a lower electrode and the shower head 3 serves as an upper electrode. The stage 2 serving as the lower electrode is grounded via a capacitor (not shown).

Radio-frequency power (hereinafter also referred to as "RF power") is applied to the shower head 3 serving as the upper electrode by the RF power supplier 8. The RF power supplier 8 has a feed line 81, a matching device 82, and a radio-frequency power supply 83. The radio-frequency power supply 83 is a power supply that generates radio-frequency power. The radio-frequency power has a frequency suitable for plasma generation. The frequency of the radio-frequency power is a frequency within a range of, for example, 450 KHz to 100 MHz. The radio-frequency power supply 83 is connected to the body portion 31 of the shower head 3 via the matching device 82 and the feed line 81. The matching device 82 has a circuit for matching the output reactance of the radio-frequency power supply 83 and the reactance of a load (upper electrode). Although the RF power supplier 8 has been described as applying radio-frequency power to the shower head 3 serving as the upper electrode, the present disclosure is not limited thereto. The present disclosure may employ a configuration in which the radio-frequency power is applied to the stage 2 serving as the lower electrode. Further, the substrate treatment device may not have a configuration for applying the radio-frequency power.

The controller 9 is, for example, a computer and includes a CPU (Central Processing Unit), a RAM (Random Access Memory), a ROM (Read Only Memory), an auxiliary storage device, and the like. The CPU operates based on programs stored in the ROM or the auxiliary storage device and controls the operation of the substrate treatment device. The controller 9 may be provided inside the substrate treatment device, or may be provided outside the substrate treatment device. When the controller 9 is provided outside the substrate treatment device, the controller 9 can control the substrate treatment device through wired or wireless communication means.

Figure 2:
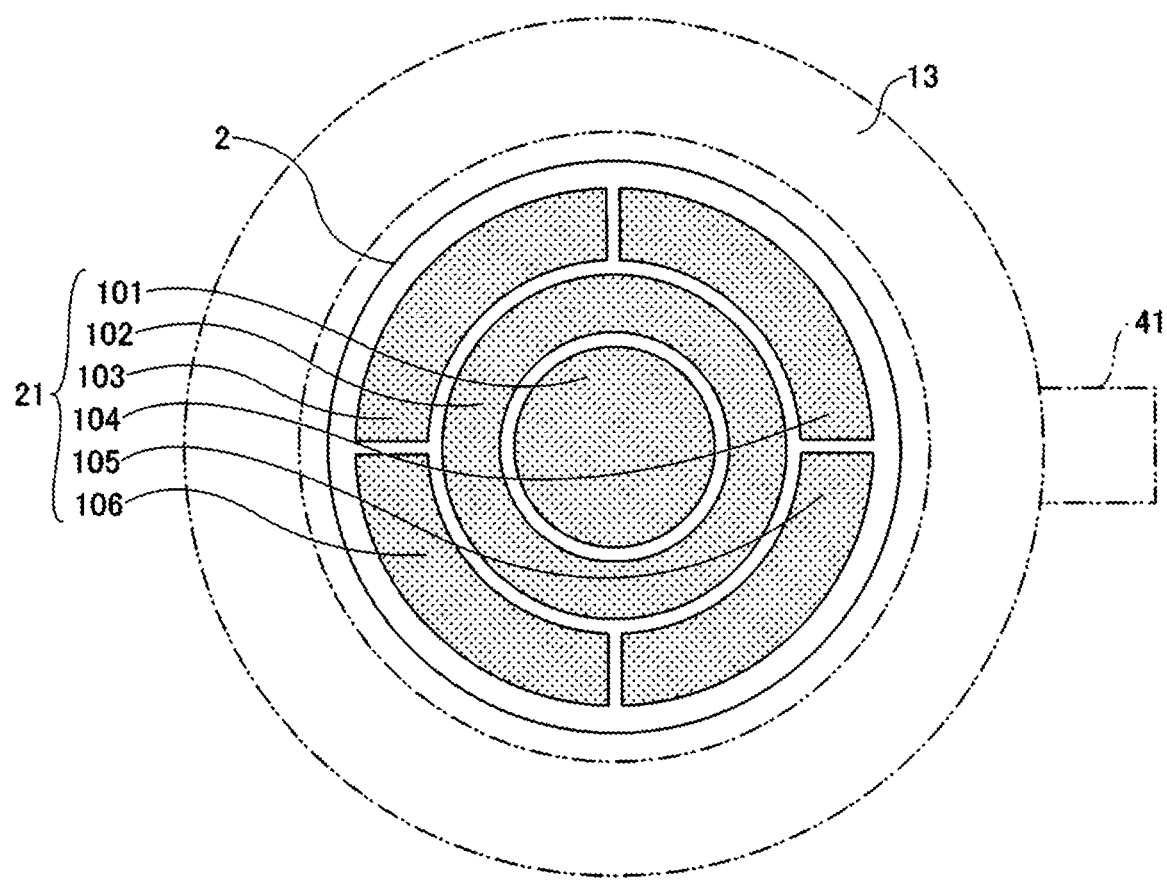
FIG. 2 is a plan view for explaining an example of arrangement of heaters on a stage.

Next, the arrangement of the heater 21 provided on the stage 2 will be described with reference to FIG. 2. FIG. 2 is a plan view for explaining an example of an arrangement of the heater 21 on the stage 2.

The heater 21 has a plurality of divided regions and can heat each region independently. In the example shown in FIG. 2, the heater 21 is divided into a first region 101 to a sixth region 106. The heater power supply 26 (see FIG. 1) controls supply of power individually for each of regions (the first region 101 to the sixth region 106) of the heater 21. The first region 101 is formed in a circular shape at the center of the stage 2. The second region 102 is formed in an annular shape radially outside the first region 101. The third region 103 to sixth region 106 are formed radially outside the second region 102. Further, the third region 103 to the sixth region 106 provided on the outer periphery are divided in the circumferential direction. With such a configuration, the temperature of the substrate W mounted on the stage 2 can be controlled for each of the regions (the first region 101 to the sixth region 106). Further, by controlling the supply of power to the third region 103 to the sixth region 106 provided on the outer circumference, the temperature of the outer periphery of the substrate W mounted on the stage 2 can be controlled.

FIG. 3 is a diagram showing an example of a temperature profile table of the heater 21, which is stored in the controller 9. The controller 9 stores the temperature profile table showing a temperature distribution for each region of the heater 21. In the example shown in FIG. 3, in temperature profile 1 (Prof. 1), the third region 103 and the fourth region 104 are set to a high temperature, and the fifth region 105 and the sixth region 106 are set to a low temperature. In temperature profile 2 (Prof. 2), the fifth region 105 and the sixth region 106 are set to a high temperature, and the third region 103 and the fourth region 104 are set to a low temperature. The controller 9 independently controls the plurality of regions (the first region 101 to the sixth region 106) of the heater 21 by controlling the heater power supply 26, based on the temperature profiles.

Next, a description will be given of a deviation in performing a process such as a film forming process on the substrate W using the substrate treatment device.

As shown in FIG. 1, a gas supplied from the gas supply mechanism 5 is supplied from the shower head 3 to the processing space 38. Then, the gas flows from the processing space 38 into the exhaust duct 13 through the annular gap 39 and the slit 13a. Then, the gas is exhausted from the exhaust duct 13 to the exhaust mechanism 42 through the exhaust pipe 41. Here, as shown in FIG. 2, the exhaust pipe 41 is provided in a specific direction with respect to the circumferential direction. Therefore, the gas flow in the processing space 38 may be deviated in the circumferential direction. Further, the flow of gas in the processing space 38 may be deviated in the circumferential direction due to the structure of the shower head 3 that supplies a gas into the processing space 38. Due to the environment in the process container 1 in which the flow of gas is deviated, in-plane uniformity of the processing on the substrate W may be degraded. For example, in the film forming process, if the flow of gas is deviated toward the exhaust pipe 41, the film thickness of the substrate W increases in the direction of the exhaust pipe 41.

Further, the process container 1 has an asymmetrical structure with respect to the circumferential direction. For example, the wall surface of the process container 1 is provided with the gate valve 12 in a specific direction and is uneven in the circumferential direction. Further, the structure of the shower head 3 may be uneven in the circumferential direction. Further, even if the structure of the shower head 3 is even in the circumferential direction, due to the arrangement of an opening/closing mechanism of the ceiling wall 14 that fixes the shower head 3, the gas supply line 56, and a cooling flow path that cools the ceiling wall 14, the structure of the process container 1 may be uneven in the circumferential direction. Therefore, there is a possibility that temperature deviation occurs in the environment in the processing space 38. Due to the environment in the process container 1 having this temperature deviation, there is a possibility that the in-plane uniformity of the processing of the substrate W may be degraded. For example, the temperature deviation may cause a difference in a substrate processing reaction rate between a high temperature region and a low temperature region.

The substrate processing in the substrate treatment device according to the present embodiment includes a plurality of steps separated by time. Further, the controller 9 controls the heater 21 (the first region 101 to the sixth region 106) and the rotation mechanism 25 in each step. Here, the control of the heater 21 (the first region 101 to the sixth region 106) controls the temperature of the substrate W mounted on the stage 2 by controlling the temperature distribution of the heater 21 (the first region 101 to the sixth region 106) through the heater power supply 26. Further, the control of the rotation mechanism 25 controls at least one of rotation or stop, rotation direction, and rotation speed of the stage 2. Further, the controller 9 controls the heater 21 and the rotation mechanism 25 independently or synchronously. As a result, deviation in gas flow and temperature due to the environment in the process container 1 is corrected and the in-plane uniformity of substrate processing is improved.

First Operation Example

Figure 5A:
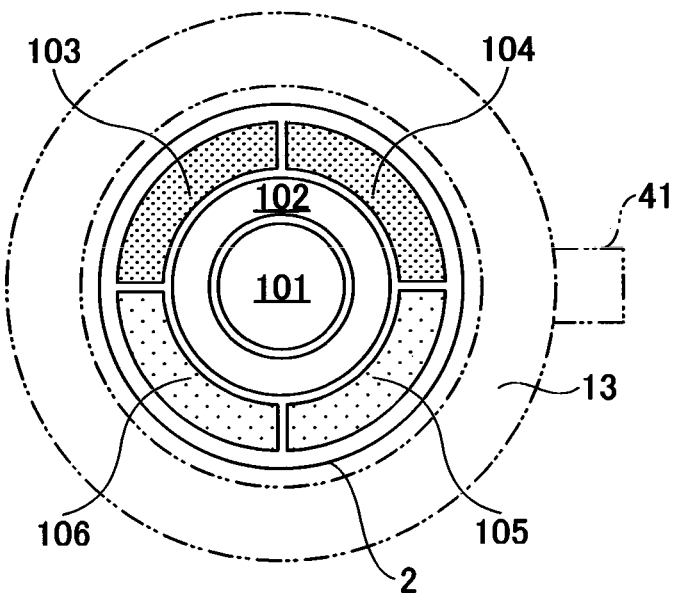
FIG. 5A is a plan view for explaining the arrangement and temperature control of each region of a heater in the first operation example.
Figure 5B:
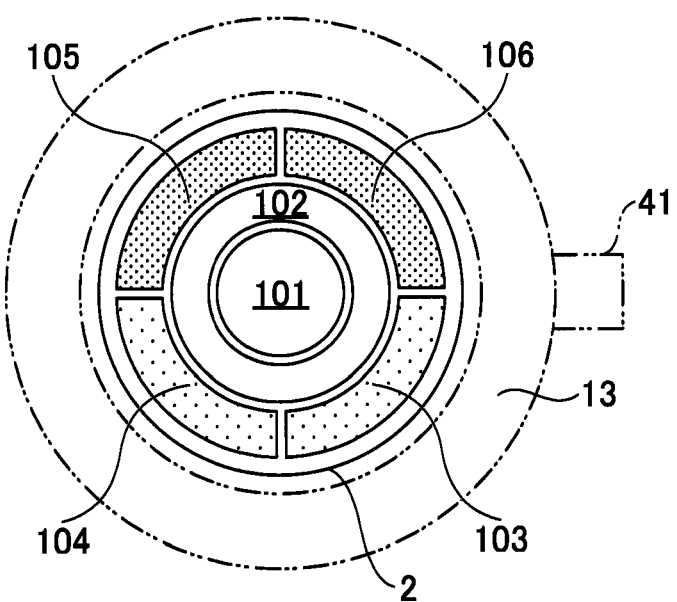
FIG. 5B is a plan view for explaining the arrangement and temperature control of each region of the heater in the first operation example.

An example of the operation of the substrate treatment device according to the present embodiment will be described with reference to FIGS. 4, 5A and 5B. Here, the substrate treatment device will be described with an example of a CVD apparatus that applies a film forming process to the substrate W. FIG. 4 is a flowchart showing a first operation example in the substrate treatment device. FIGS. 5A and 5B are plan views for explaining an arrangement and temperature control of each region of the heater 21 in the first operation example. In FIGS. 5A and 5B, high temperature regions are indicated by fine dots, and low temperature regions are indicated by rough dots.

In step S101, the controller 9 performs a preparation step. In the preparation step, the controller 9 opens the gate valve 12. A substrate W is transferred into the process container 1 from the loading/unloading port 11 by a transfer device (not shown) and is mounted on the stage 2. When the transfer device retreats from the loading/unloading port 11, the controller 9 closes the gate valve 12. Next, the controller 9 controls the exhaust mechanism 42 to exhaust the interior of the process container. Next, the controller 9 controls the elevating mechanism 24 to raise the stage 2 from the transfer position to the processing position. Further, the controller 9 may control the heater power supply 26 to cause the heater 21 to generate heat, thereby preheating the substrate W mounted on the stage 2.

Next, the controller 9 performs a film-forming step. In the film-forming step, a process gas is supplied from the gas supply mechanism 5 to the processing space 38 through the shower head 3. Further, the film-forming step has a plurality of steps (S102 to S106) separated in time.

In step S102, the controller 9 forms a film with temperature profile 1 while rotating the stage 2. In this step, the controller 9 controls the heater power supply 26 with the temperature distribution of each region of the heater 21 as temperature profile 1 (Prof. 1). Further, the controller 9 controls the rotation mechanism 25 to rotate the stage 2 and the substrate W. Here, for example, they are rotated by 180° for a predetermined time. A film forming process is performed on the substrate W by the process gas supplied to the processing space 38. After the predetermined time has passed, the process of the controller 9 proceeds to step S103.

In step S103, the controller 9 stops the rotation of the stage 2 and forms a film with temperature profile 1. In this step, the controller 9 controls the heater power supply 26 with the temperature distribution of each region of the heater 21 as temperature profile 1 (Prof. 1). Further, the controller 9 also controls the rotation mechanism 25 to stop the rotation of the stage 2. A film forming process is performed on the substrate W by the process gas supplied to the processing space 38. Then, after a predetermined time has passed, the process of the controller 9 proceeds to step S104. Further, the predetermined time in step S103 may be longer than the time required for rotating the stage 2 in step S102.

Here, FIG. 5A shows the arrangement and temperature control of each region of the heater 21 in step S103. Here, it is assumed that the substrate treatment device has a temperature deviation occurring such that the temperature is relatively low on the upper side of the paper and relatively high on the lower side of the paper. According to the stored table (see FIG. 3), the controller 9 controls the heaters 21 in the third region 103 and the fourth region 104 to be at a high temperature and controls the heaters 21 in the fifth region 105 and the sixth region 106 to be at a low temperature. This improves the in-plane uniformity of the temperature of the substrate W mounted on the stage 2.

In step S104, the controller 9 forms a film with temperature profile 2 while rotating the stage 2. In this step, the controller 9 controls the heater power supply 26 with the temperature distribution of each region of the heater 21 as temperature profile 2 (Prof. 2). Further, the controller 9 controls the rotation mechanism 25 to rotate the stage 2 and the substrate W. Here, for example, they are rotated by 180° for a predetermined time. A film forming process is performed on the substrate W by the process gas supplied to the processing space 38. After the predetermined time has passed, the process of the controller 9 proceeds to step S105.

In step S105, the controller 9 stops the rotation of the stage 2 and forms a film with temperature profile 2. In this step, the controller 9 controls the heater power supply 26 with the temperature distribution of each region of the heater 21 as temperature profile 2 (Prof. 2). Further, the controller 9 controls the rotation mechanism 25 to stop the rotation of the stage 2. A film forming process is performed on the substrate W by the process gas supplied to the processing space 38. Then, after a predetermined time has passed, the process of the controller 9 proceeds to step S106. Further, the predetermined time in step S105 may be longer than the time required for rotating the stage 2 in step S106.

Here, FIG. 5B shows the arrangement and temperature control of each region of the heater 21 in step S105. Here, as described above, it is assumed that the substrate treatment device has a temperature deviation occurring such that the temperature is relatively low on the upper side of the paper and relatively high on the lower side of the paper. According to the stored table (see FIG. 3), the controller 9 controls the heaters 21 in the third region 103 and the fourth region 104 to be at a low temperature and controls the heaters 21 in the fifth region 105 and the sixth region 106 to be at a high temperature. This improves the in-plane uniformity of the temperature of the substrate W mounted on the stage 2.

Further, in step S104, by rotating the stage 2 in the stopped state again, deviation in the amount of film formation due to the deviation of gas flow can be suppressed, thereby improving the in-plane uniformity in the amount of film formation on the substrate W.

In step S106, the controller 9 determines whether or not steps S102 to S105 have been repeated a predetermined number of times. If the number of repetitions is less than the predetermined number of times ("NO" in S106), the process of the controller 9 repeats steps S102 to S105. When the predetermined number of repetitions is completed ("YES" in S106), the film-forming step is terminated and the supply of the process gas from the gas supply mechanism 5 is stopped. Then, the process of the controller 9 proceeds to step S107.

In step S107, the controller 9 performs a purge step. In the purge step, the controller 9 controls the exhaust mechanism 42 to exhaust the interior of the process container. After that, the controller 9 controls the elevating mechanism 24 to lower the stage 2 from the processing position to the transfer position. The controller 9 opens the gate valve 12. The substrate W is transferred out of the process container 1 by the transfer device (not shown). When the transfer device retreats from the loading/unloading port 11, the controller 9 closes the gate valve 12.

As described above, the substrate treatment device according to the present embodiment can control the temperature of the heater 21 in the circumferential direction and can rotate the stage 2 in the circumferential direction. Further, the temperature control of the heater 21 and the rotation control of the stage 2 can be performed independently for each step of the film forming process of the substrate W. In other words, the temperature control of the heater 21 and the rotation control of the stage 2 can be switched with the start of each step as a trigger.

Further, the effect of the deviation of gas flow and the deviation of temperature in the circumferential direction becomes more substantial on the outer peripheral side of the substrate W in comparison to the central side of the substrate W. In the substrate treatment device according to the present embodiment, at least the outer peripheral portion (the third region 103 to the sixth region 106) of the heater 21 is divided in the circumferential direction so that the temperature can be controlled independently. As a result, the temperature of the outer peripheral portion of the substrate W mounted on the stage 2 can be controlled. Therefore, the in-plane uniformity of the film forming process performed on the substrate W can be improved.

Further, according to the first operation example of the substrate treatment device, the temperature distribution (profile) of the heater 21 is controlled when the substrate W is rotated together with the stage 2. By rotating the substrate W, the deviation of gas flow can be corrected. Further, by changing the temperature distribution (profile) of the heater 21, the temperature distribution of the substrate W can be suitably corrected even when the substrate W is rotated. In this way, the in-plane uniformity of the film forming process performed on the substrate W can be improved by correcting the deviation of gas flow and the deviation of temperature.

Further, in the first operation example, the stage 2 is rotated once in one cycle (S102 to S105). As a result, in the first operation example, the in-plane uniformity of the film forming process in one cycle (S102 to S105) can be improved. In the first operation example, it has been described that the in-plane uniformity is improved by one rotation of the stage 2 in one cycle, but this is not the only option. For example, a plurality of rotations (for example, two or three rotations) may be performed in one cycle, and uniformity can be improved by a half rotation or a quarter rotation if the deviation of gas flow is line-symmetric. Further, in the first operation example, the operation may be started from the state where the stage 2 is stopped.

Second Operation Example

Next, another example of the operation of the substrate treatment device according to the present embodiment will be described with reference to FIGS. 6 to 8D. Here, a description will be given with an example where the substrate treatment device is a CVD apparatus that applies a film forming process to the substrate W.

FIG. 6 is a diagram showing another example of the temperature profile table of the heater 21 stored in the controller 9. The controller 9 stores a temperature profile table showing a temperature distribution for each region of the heater 21. Here, the temperature profile table is shown as a ratio of the amount of power supplied from the heater power supply 26 to each of the regions (the first region 101 to the sixth region 106).

In the example shown in FIG. 6, in temperature profile 1 (Prof. 1), the amount of supply of power in the third region 103 and the fourth region 104 is set to be high, and the amount of supply of power in the fifth region 105 and the sixth region 106 is set to be low. In temperature profile 2 (Prof. 2), the amount of supply of power in the fifth region 105 and the sixth region 106 is set to be high, and the amount of supply of power in the third region 103 and the fourth region 104 is set to be low. In temperature profile 3 (Prof. 3), the amount of supply of power in the third region 103 to the sixth region 106 is set to be equal.

In temperature profile 4 (Prof. 4), the amount of supply of power in the third region 103 and the fourth region 104 is set to be high, and the amount of supply of power in the fifth region 105 and the sixth region 106 is set to be low. In temperature profile 5 (Prof. 5), the amount of supply of power in the fifth region 105 and the sixth region 106 is set to be high, and the amount of supply of power in the third region 103 and the fourth region 104 is set to be low. In temperature profile 3 (Prof. 3), the amount of supply of power in the third region 103 to the sixth region 106 is set to be equal. Further, temperature profiles 1 to 3 and temperature profiles 4 and 5 are different in setting of the amount of supply of power in the first region 101 and the second region 102.

FIG. 7 is a flowchart showing a second operation example in the substrate treatment device. FIGS. 8A to 8D are plan views for explaining the arrangement and temperature control of each region of the heater 21 in the second operation example. In FIGS. 8A to 8D, regions where the amount of supply of power is high (high temperature regions) are indicated by fine dots, and regions where the amount of supply of power is low (low temperature regions) are indicated by rough dots.

In step S201, the controller 9 performs a preparation step. The preparation step is the same as the preparation step of step S101, and explanation thereof will not be repeated.

Next, the controller 9 performs a film-forming step. In the film-forming step, a process gas is supplied from the gas supply mechanism 5 to the processing space 38 through the shower head 3. Further, the film-forming step has a plurality of steps (S202 to S206) separated in time.

In step S202, the controller 9 forms a film with temperature profile 1 while rotating the stage 2. In this step, the controller 9 controls the heater power supply 26 with the temperature distribution of each region of the heater 21 as temperature profile 1 (Prof. 1). Further, the controller 9 controls the rotation mechanism 25 to rotate the stage 2 and the substrate W. Here, for example, they are rotated by 90° for a predetermined time. A film forming process is performed on the substrate W by the process gas supplied to the processing space 38.

In step S203, the controller 9 forms a film with temperature profile 3 while rotating the stage 2. In this step, the controller 9 controls the heater power supply 26 with the temperature distribution of each region of the heater 21 as temperature profile 3 (Prof. 3). Further, the controller 9 controls the rotation mechanism 25 to rotate the stage 2 and the substrate W. Here, for example, they are rotated by 90° for a predetermined time. A film forming process is performed on the substrate W by the process gas supplied to the processing space 38.

In step S204, the controller 9 forms a film with temperature profile 2 while rotating the stage 2. In this step, the controller 9 controls the heater power supply 26 with the temperature distribution of each region of the heater 21 as temperature profile 2 (Prof. 2). Further, the controller 9 controls the rotation mechanism 25 to rotate the stage 2 and the substrate W. Here, for example, they are rotated by 90° for a predetermined time. A film forming process is performed on the substrate W by the process gas supplied to the processing space 38.

In step S205, the controller 9 forms a film with temperature profile 3 while rotating the stage 2. In this step, the controller 9 controls the heater power supply 26 with the temperature distribution of each region of the heater 21 as temperature profile 3 (Prof. 3). Further, the controller 9 controls the rotation mechanism 25 to rotate the stage 2 and the substrate W. Here, for example, they are rotated by 90° for a predetermined time. A film forming process is performed on the substrate W by the process gas supplied to the processing space 38.

Figure 8A:
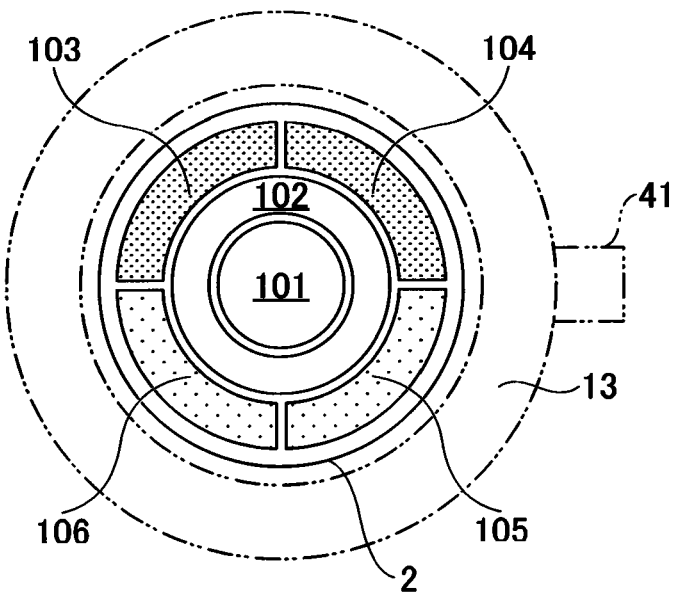
FIG. 8A is a plan view for explaining an arrangement and temperature control of each region of a heater in the second operation example.
Figure 8B:
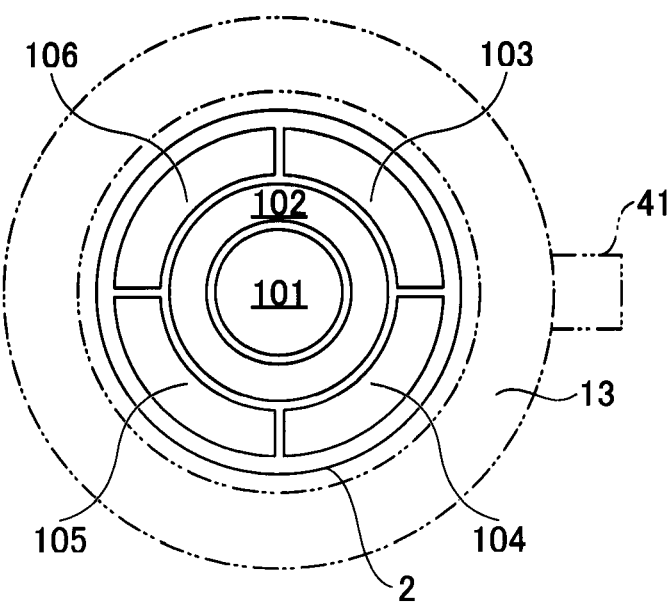
FIG. 8B is a plan view for explaining the arrangement and temperature control of each region of the heater in the second operation example.
Figure 8C:
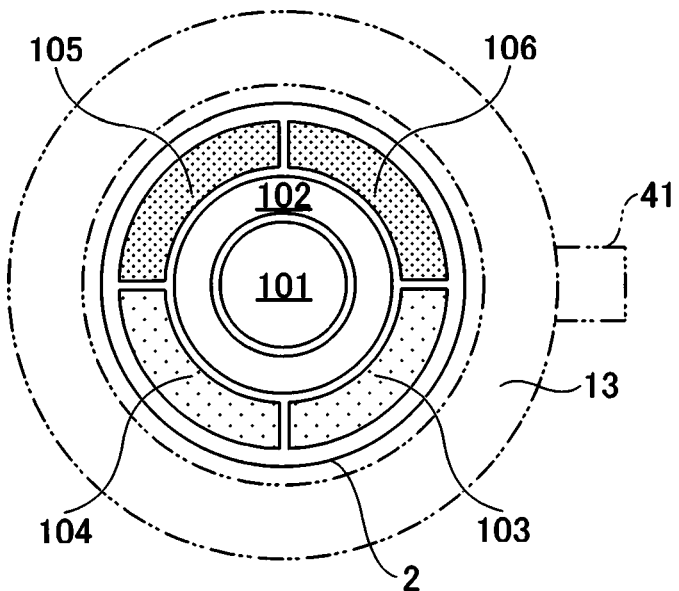
FIG. 8C is a plan view for explaining the arrangement and temperature control of each region of the heater in the second operation example.
Figure 8D:
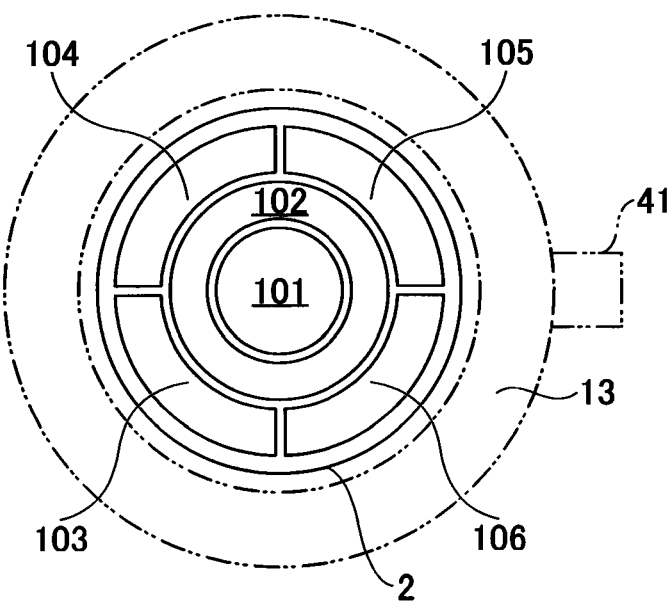
FIG. 8D is a plan view for explaining the arrangement and temperature control of each region of the heater in the second operation example.

Here, FIG. 8A shows the arrangement and temperature control of each region of the heater 21 in step S202. FIG. 8B shows the arrangement and temperature control of each region of the heater 21 in step S203. FIG. 8C shows the arrangement and temperature control of each region of the heater 21 in step S204. FIG. 8D shows the arrangement and temperature control of each region of the heater 21 in step S205. Here, as described above, it is assumed that the substrate treatment device has a temperature deviation occurring such that the temperature is relatively low on the upper side of the paper and relatively high on the lower side of the paper. The controller 9 controls the heaters 21 in the third region 103 to the sixth region 106 according to the table (see FIG. 6). This improves the in-plane uniformity of the temperature of the substrate W mounted on the stage 2.

Further, in steps S202 to S205, by rotating the stage 2, deviation in the amount of film formation due to the deviation of gas flow can be suppressed, thereby improving the in-plane uniformity in the amount of film formation on the substrate W.

In step S206, the controller 9 determines whether or not steps S202 to S205 have been repeated a predetermined number of times. If the number of repetitions is less than the predetermined number of times ("NO" in S206), the process of the controller 9 repeats steps S202 to S205. When the predetermined number of repetitions is completed ("YES" in S206), the film-forming step is terminated and the supply of the process gas from the gas supply mechanism 5 is stopped. Then, the process of the controller 9 proceeds to step S207.

In step S207, the controller 9 performs a purge step. The purge step is the same as the purge step of step S107, and explanation thereof will not be repeated.

As described above, according to the second operation example of the substrate treatment device, the temperature distribution (profile) of the heater 21 is controlled for each rotation angle of the stage 2 without stopping the rotation of the stage 2 and the substrate W. By rotating the substrate W, the deviation of gas flow can be corrected. Further, by changing the temperature distribution (profile) of the heater 21, the temperature distribution of the substrate W can be suitably corrected even when the substrate W is rotated. In this way, the in-plane uniformity of the film forming process performed on the substrate W can be improved by correcting the deviation of gas flow and the deviation of temperature.

Further, in the second operation example, the stage 2 is rotated once in one cycle (S202 to S205). As a result, in the second operation example, the in-plane uniformity of the film forming process in one cycle (S202 to S205) can be improved. In the second operation example, it has been described that the in-plane uniformity is improved by one rotation of the stage 2 in one cycle, but this is not the only option. For example, a plurality of rotations (for example, two or three rotations) may be performed in one cycle, and uniformity can be improved by a half rotation or a quarter rotation if the deviation of gas flow is line-symmetric. Further, in the second operation example, the operation may be started from the state where the stage 2 is stopped.

Third Operation Example

Figure 9:
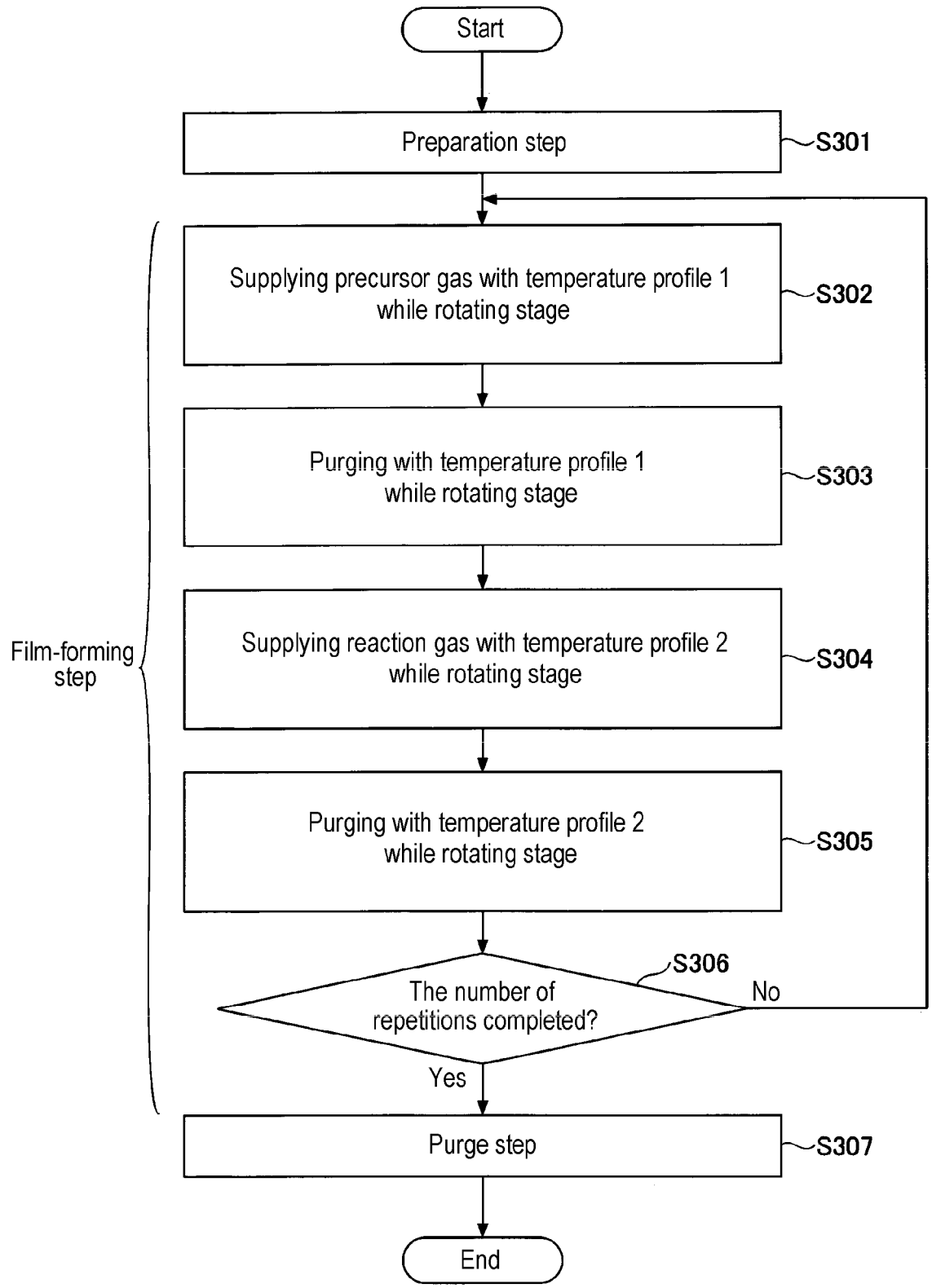
FIG. 9 is a flowchart showing a third operation example in the substrate treatment device.

Next, another example of the operation of the substrate treatment device according to the present embodiment will be described with reference to FIG. 9. Here, a description will be given with an example where the substrate treatment device is an ALD apparatus that applies a film forming process to the substrate W. FIG. 9 is a flowchart showing a third operation example in the substrate treatment device.

Further, in this example, the controller 9 controls the heater power supply 26 based on the temperature profile table of the heater 21 shown in FIG. 3.

In step S301, the controller 9 performs a preparation step. The preparation step is the same as the preparation step of step S101, and explanation thereof will not be repeated.

Next, the controller 9 performs a film-forming step. In the film-forming step, a process gas is supplied from the gas supply mechanism 5 to the processing space 38 through the shower head 3. Further, the film-forming step has a plurality of steps (S302 to S306) separated in time.

In step S302, the controller 9 supplies a precursor gas with temperature profile 1 while rotating the stage 2. In this step, the controller 9 controls the heater power supply 26 with the temperature distribution of each region of the heater 21 as temperature profile 1 (Prof. 1). Further, the controller 9 controls the rotation mechanism 25 to rotate the stage 2 and the substrate W. Further, a precursor gas (for example, a $TiCl_4$ gas) is supplied from the gas supply mechanism 5 to the processing space 38 through the shower head 3. As a result, the precursor is adsorbed on the surface of the substrate W. Then, after a predetermined time has passed, the supply of the precursor gas from the gas supply mechanism 5 is stopped.

In step S303, the controller 9 purges with temperature profile 1 while rotating the stage 2. In this step, the controller 9 controls the heater power supply 26 with the temperature distribution of each region of the heater 21 as temperature profile 1 (Prof. 1). Further, the controller 9 controls the rotation mechanism 25 to rotate the stage 2 and the substrate W. Further, an unadsorbed precursor gas in the processing space 38 is exhausted (purged) by the exhaust mechanism 42.

In step S304, the controller 9 supplies a reaction gas with temperature profile 2 while rotating the stage 2. In this step, the controller 9 controls the heater power supply 26 with the temperature distribution of each region of the heater 21 as temperature profile 2 (Prof. 2). Further, the controller 9 controls the rotation mechanism 25 to rotate the stage 2 and the substrate W. Further, a reaction gas (for example, an $NH_3$ gas) is supplied from the gas supply mechanism 5 to the processing space 38 through the shower head 3. As a result, the precursor adsorbed on the surface of the substrate W reacts with the reaction gas. Then, after a predetermined time has passed, the supply of the reaction gas from the gas supply mechanism 5 is stopped.

In step S305, the controller 9 purges with temperature profile 2 while rotating the stage 2. In this step, the controller 9 controls the heater power supply 26 with the temperature distribution of each region of the heater 21 as temperature profile 2 (Prof. 2). Further, the controller 9 controls the rotation mechanism 25 to rotate the stage 2 and the substrate W. Further, an unreacted reaction gas and reaction by-products in the processing space 38 are exhausted (purged) by the exhaust mechanism 42.

In step S306, the controller 9 determines whether or not steps S302 to S305 have been repeated a predetermined number of times. If the number of repetitions is less than the predetermined number of times ("NO" in S306), the process of the controller 9 repeats steps S302 to S305. When the predetermined number of repetitions is completed ("YES" in S306), the film-forming step is terminated, and the process of the controller 9 proceeds to step S307.

In step S307, the controller 9 performs a purge step. The purge step is the same as the purge step of step S107, and explanation thereof will not be repeated.

As described above, according to the third operation example of the substrate treatment device, the temperature distribution (temperature profile) of the heater 21 is controlled for each rotation angle of the stage 2 without stopping the rotation of the stage 2 and the substrate W. By rotating the substrate W, the deviation of gas flow can be corrected. Further, by changing the temperature distribution (temperature profile) of the heater 21, the temperature distribution of the substrate W can be suitably corrected even when the substrate W is rotated. In this way, the in-plane uniformity of the film forming process performed on the substrate W can be improved by correcting the deviation of gas flow and the deviation of temperature. Further, a step of stopping the rotation may be included in the same manner as in the first operation example in order to correct the deviation of gas flow and the deviation of temperature.

Further, in the above-described first operation example and second operation example, the stage 2 is rotated once in one cycle (S102 to S105 and S202 to S205). On the other hand, in the third operation example, the rotation speed of the stage 2 is set so as to be asynchronous with the ALD processing cycle (S302 to S305). As a result, the rotation angle of the stage 2 can be shifted for each cycle (S302 to S305), and the gas flow can be made uniform by repeating a predetermined cycle, thereby improving the in-plane uniformity of the film forming process performed on the substrate W.

Fourth Operation Example

Figure 10:
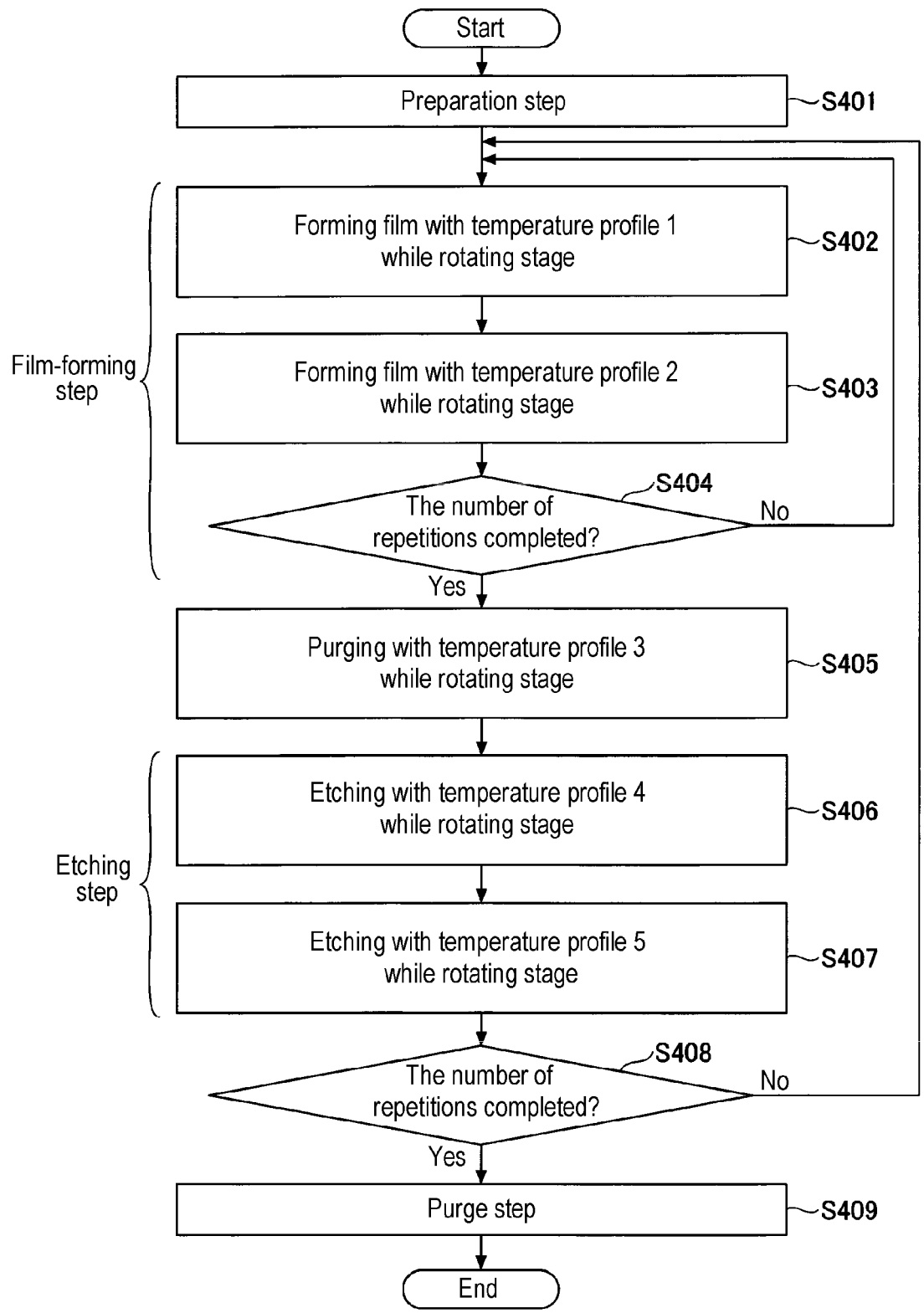
FIG. 10 is a flowchart showing a fourth operation example in the substrate treatment device.

Next, another example of the operation of the substrate treatment device according to the present embodiment will be described with reference to FIG. 10. Here, a description will be given with an example where the substrate treatment device is a substrate treatment device that applies a film forming process and an etching process to the substrate W. FIG. 10 is a flowchart showing a fourth operation example in the substrate treatment device. Further, in this example, the controller 9 controls the heater power supply 26 based on the temperature profile table of the heater 21 shown in FIG. 6.

In step S401, the controller 9 performs a preparation step. The preparation step is the same as the preparation step of step S101, and explanation thereof will not be repeated.

Next, the controller 9 performs a film-forming step. In the film-forming step, a process gas for film formation is supplied from the gas supply mechanism 5 to the processing space 38 through the shower head 3. Further, the film-forming step has a plurality of steps (S402 and S403) separated in time.

In step S402, the controller 9 forms a film with temperature profile 1 while rotating the stage 2. In this step, the controller 9 controls the heater power supply 26 with the temperature distribution of each region of the heater 21 as temperature profile 1 (Prof. 1). Further, the controller 9 controls the rotation mechanism 25 to rotate the stage 2 and the substrate W. Here, for example, they are rotated by 180° for a predetermined time. A film forming process is performed on the substrate W by the process gas supplied to the processing space 38.

In step S403, the controller 9 forms a film with temperature profile 2 while rotating the stage 2. In this step, the controller 9 controls the heater power supply 26 with the temperature distribution of each region of the heater 21 as temperature profile 2 (Prof. 2). Further, the controller 9 controls the rotation mechanism 25 to rotate the stage 2 and the substrate W. Here, for example, they are rotated by 180° for a predetermined time. A film forming process is performed on the substrate W by the process gas supplied to the processing space 38.

In step S404, the controller 9 determines whether or not steps S402 and S403 have been repeated a predetermined number of times. If the number of repetitions is less than the predetermined number of times ("NO" in S404), the process of the controller 9 repeats steps S402 and S403. When the predetermined number of repetitions is completed ("YES" in S404), the film-forming step is terminated and the supply of the process gas from the gas supply mechanism 5 is stopped. Then, the process of the controller 9 proceeds to step S405.

In step S405, the controller 9 purges with temperature profile 3 while rotating the stage 2. In this step, the controller 9 controls the heater power supply 26 with the temperature distribution of each region of the heater 21 as temperature profile 3 (Prof. 3). Further, the controller 9 controls the rotation mechanism 25 to rotate the stage 2 and the substrate W. Further, a gas in the processing space 38 is exhausted (purged) by the exhaust mechanism 42.

Next, the controller 9 performs an etching step. In the etching step, a process gas for etching is supplied from the gas supply mechanism 5 to the processing space 38 through the shower head 3. Further, the etching step has a plurality of steps (S406 and S407) separated in time.

In step S406, the controller 9 performs etching with temperature profile 4 while rotating the stage 2. In this step, the controller 9 controls the heater power supply 26 with the temperature distribution of each region of the heater 21 as temperature profile 4 (Prof. 4). Further, the controller 9 controls the rotation mechanism 25 to rotate the stage 2 and the substrate W. Here, for example, they are rotated by 180° for a predetermined time. An etching process is performed on the substrate W by the process gas supplied to the processing space 38.

In step S407, the controller 9 performs etching with temperature profile 5 while rotating the stage 2. In this step, the controller 9 controls the heater power supply 26 with the temperature distribution of each region of the heater 21 as temperature profile 5 (Prof. 5). Further, the controller 9 controls the rotation mechanism 25 to rotate the stage 2 and the substrate W. Here, for example, they are rotated by 180° for a predetermined time. An etching process is performed on the substrate W by the process gas supplied to the processing space 38. Then, the supply of the process gas from the gas supply mechanism 5 is stopped.

In step S408, the controller 9 determines whether or not steps S402 to S407 have been repeated a predetermined number of times. If the number of repetitions is less than the predetermined number of times ("NO" in S408), the process of the controller 9 repeats steps S402 to S407. When the predetermined number of repetitions is completed ("YES" in S408), the film-forming step and the etching step are terminated, and the process of the controller 9 proceeds to step S409.

In step S409, the controller 9 performs a purge step. The purge step is the same as the purge step of step S107, and explanation thereof will not be repeated.

As described above, according to the fourth operation example of the substrate treatment device, the temperature distribution (profile) of the heater 21 is controlled for each rotation angle of the stage 2 without stopping the rotation of the stage 2 and the substrate W. By rotating the substrate W, the deviation of gas flow can be corrected. Further, by changing the temperature distribution (profile) of the heater 21, the temperature distribution of the substrate W can be suitably corrected even when the substrate W is rotated. In this way, the in-plane uniformity of the film forming process performed on the substrate W can be improved by correcting the deviation of gas flow and the deviation of temperature.

Further, the substrate treatment device according to the present embodiment can control the temperature of the heater 21 in the circumferential direction and independently control the rotation of the stage 2 in the circumferential direction. Thereby, the temperature profile during the film forming process and the temperature profile during the etching process can be made different. As a result, the temperature profile during the film forming process and the temperature profile during the etching process can be optimized separately.

Further, although it has been described that the stage 2 is rotated during the film forming process and the etching process, the present disclosure is not limited thereto. For example, during the etching process, the rotation of the stage 2 may be stopped and the temperature of the heater 21 may be controlled with a fixed temperature profile. Further, during the film forming process, the rotation of the stage 2 may be stopped and the temperature of the heater 21 may be controlled with a fixed temperature profile. Further, as in the first operation example, a configuration in which the stage 2 is repeatedly rotated and stopped may be employed.

Further, the rotation speed of the stage 2 is not particularly limited, but a speed at which the substrate W mounted on the stage 2 does not shift when the stage 2 is rotated (for example, 1 to 10 RPM) is preferable. Further, the rotation direction of the stage 2 can be freely selected between clockwise and counterclockwise according to the deviation of gas flow due to the configuration of the apparatus. Further, the rotation direction may be freely changed at each step in one cycle.

Experimental Results

Next, the processing in-plane uniformity of the present Example will be described in comparison with Reference Examples 1 to 3.

Figure 11:
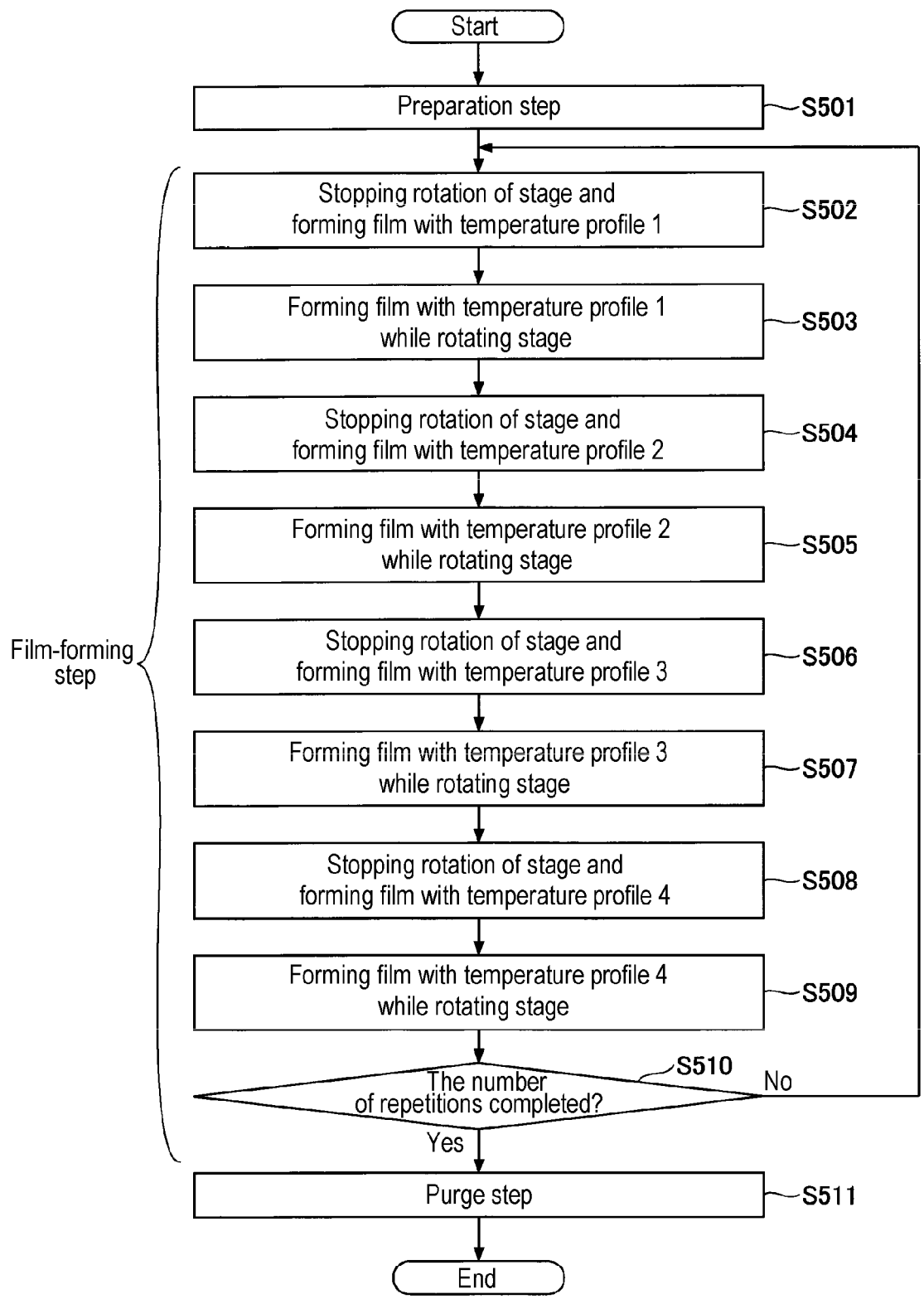
FIG. 11 is a flowchart showing an operation of the present Example in the substrate treatment device.

First, an example of the processing of the present Example will be described with reference to FIGS. 11 to 13. Here, a description will be given with an example where a substrate treatment device is a CVD apparatus that applies a film forming process to a substrate W. FIG. 11 is a flowchart showing an operation of the present Example (a modification of the first operation example) in the substrate treatment device. FIGS. 12A to 12D are plan views for explaining an arrangement and temperature control of each region of the heater 21 in the present Example. FIG. 13 is a diagram showing yet another example of the temperature profile table of the heater 21 stored in the controller 9. In FIGS. 12A to 12D, regions where the amount of supply of power is high (high temperature regions) are indicated by fine dots, and regions where the amount of supply of power is low (low temperature regions) are indicated by rough dots.

Temperature profile 1 (Prof. 1) to temperature profile 4 (Prof. 4) shown in FIG. 13 are temperature profiles used by the substrate treatment device according to the present embodiment. Temperature profile 1 (Prof. 1) to temperature profile 4 (Prof. 4) are set so that the ratio of the amount of supply of power to each region (the third region 103 to the sixth region 106) on the outer peripheral side is sequentially switched.

Temperature profile 5 (Prof. 5) shown in FIG. 13 is a temperature profile used in Reference Examples 1 and 2 which will be described later. Temperature profile 5 (Prof. 5) is set so that the ratio of the amount of supply of power to each region (the third region 103 to the sixth region 106) on the outer peripheral side is uniform.

In step S501, the controller 9 performs a preparation step. The preparation step is the same as the preparation step of step S101, and explanation thereof will not be repeated.

Next, the controller 9 performs a film-forming step. In the film-forming step, a process gas for film formation is supplied from the gas supply mechanism 5 to the processing space 38 through the shower head 3. Further, the film-forming step has a plurality of steps (S502 to S509) separated in time.

In step S502, the controller 9 stops the rotation of the stage 2 and forms a film with temperature profile 1. In this step, the controller 9 controls the heater power supply 26 with the temperature distribution of each region of the heater 21 as temperature profile 1 (Prof. 1). Further, the controller 9 controls the rotation mechanism 25 to stop the rotation of the stage 2. A film forming process is performed on the substrate W by the process gas supplied to the processing space 38. Then, after a predetermined time has passed, the process of the controller 9 proceeds to step S503. Further, the predetermined time in step S502 may be longer than the time required for rotating the stage 2 in step S503 which will be described later.

Figure 12A:
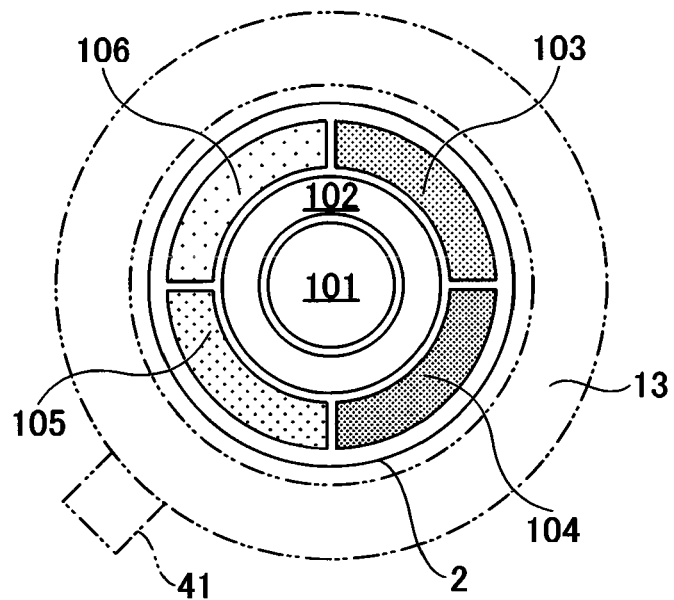
FIG. 12A is a plan view for explaining an arrangement and temperature control of each region of a heater in the present Example.

Here, FIG. 12A shows the arrangement and temperature control of each region of the heater 21 in step S502. According to the stored table (see FIG. 13), the controller 9 controls the heaters 21 in the third region 103 and the fourth region 104 to be at a high temperature and controls the heaters 21 in the fifth region 105 and the sixth region 106 to be at a low temperature.

In step S503, the controller 9 forms a film with temperature profile 1 while rotating the stage 2. In this step, the controller 9 controls the heater power supply 26 with the temperature distribution of each region of the heater 21 as temperature profile 1 (Prof. 1). Further, the controller 9 controls the rotation mechanism 25 to rotate the stage 2 and the substrate W. Here, for example, they are rotated by 90° for a predetermined time. A film forming process is performed on the substrate W by the process gas supplied to the processing space 38. After the predetermined time has elapsed, the process of the controller 9 proceeds to step S504.

Figure 12B:
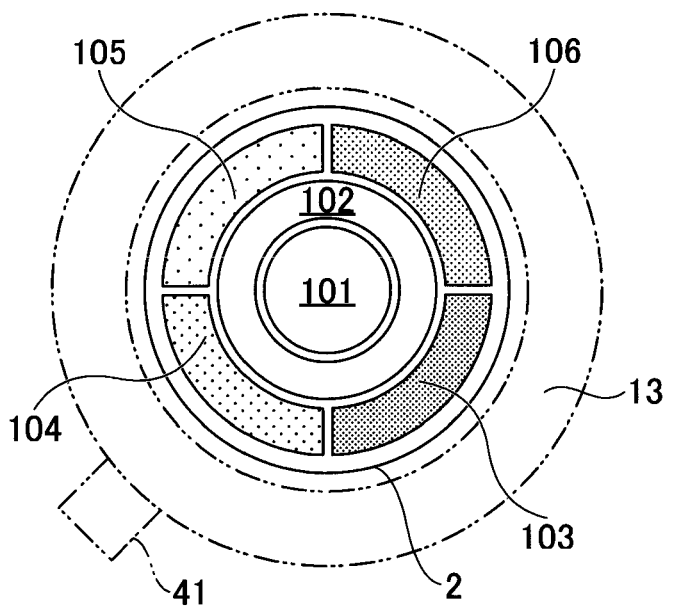
FIG. 12B is a plan view for explaining the arrangement and temperature control of each region of the heater in the present Example.

In step S504, the controller 9 stops the rotation of the stage 2 and forms a film with temperature profile 2. FIG. 12B shows the arrangement and temperature control of each region of the heater 21 in step S504. In step S505, the controller 9 forms a film with temperature profile 2 while rotating the stage 2 by 90°.

Figure 12C:
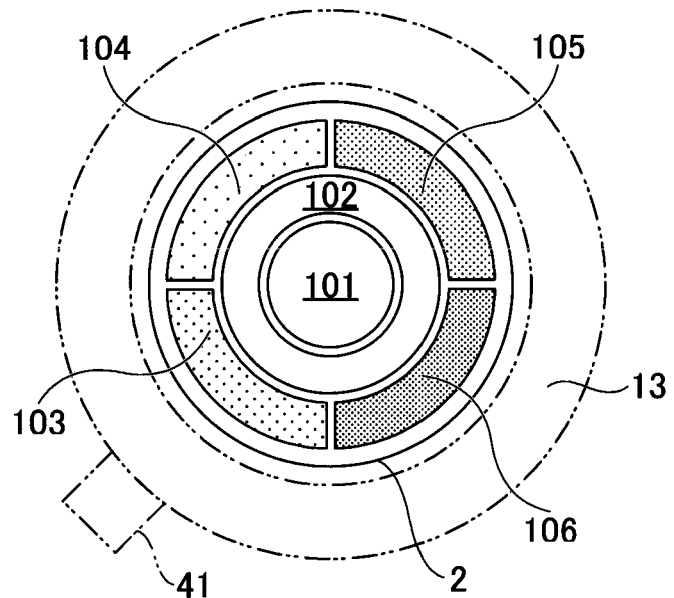
FIG. 12C is a plan view for explaining the arrangement and temperature control of each region of the heater in the present Example.

In step S506, the controller 9 stops the rotation of the stage 2 and forms a film with temperature profile 3. FIG. 12C shows the arrangement and temperature control of each region of the heater 21 in step S506. In step S507, the controller 9 forms a film with temperature profile 3 while rotating the stage 2 by 90°.

Figure 12D:
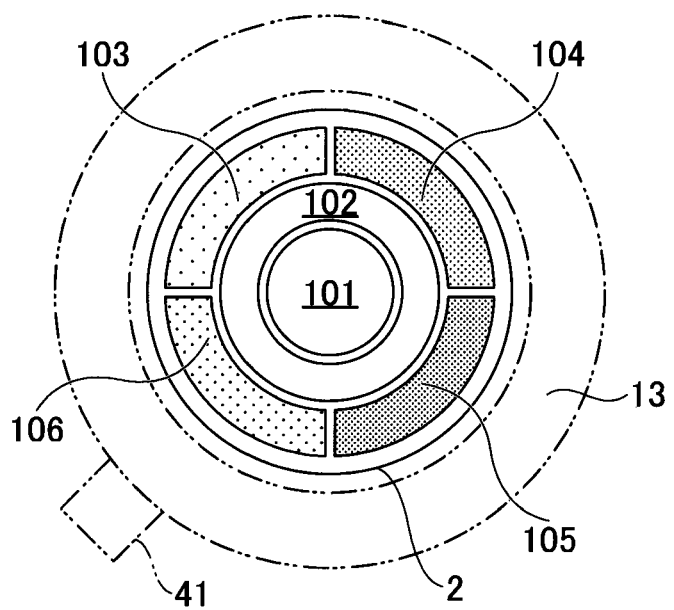
FIG. 12D is a plan view for explaining the arrangement and temperature control of each region of the heater in the present Example.

In step S508, the controller 9 stops the rotation of the stage 2 and forms a film with temperature profile 4. FIG. 12D shows the arrangement and temperature control of each region of the heater 21 in step S508. In step S509, the controller 9 forms a film with temperature profile 4 while rotating the stage 2 by 90°.

In step S510, the controller 9 determines whether or not steps S502 to S509 have been repeated a predetermined number of times. If the number of repetitions is less than the predetermined number of times ("NO" in S510), the process of the controller 9 repeats steps S502 to S509. When the predetermined number of repetitions is completed ("YES" in S510), the film forming process is terminated, and the supply of the process gas from the gas supply mechanism 5 is stopped. Then, the process of the controller 9 proceeds to step S511.

In step S511, the controller 9 performs a purge step. The purge step is the same as the purge step of step S107, and explanation thereof will not be repeated.

That is, in the present Example, while supplying the process gas at a constant flow rate and changing the temperature profile of the heater 21, the rotation stop and ¼ rotation of the stage 2 were alternately repeated to form a film up to a predetermined film thickness.

Next, Reference Examples 1 to 3 will be described.

In Reference Example 1, while supplying the process gas at a constant flow rate, the temperature profile of the heater 21 was set to temperature profile 5 (Prof. 5) uniform in the circumferential direction, i.e., the ratio of the amount of supply of power to each region (the third region 103 to the sixth region 106) on the outer peripheral side was set to be uniform, and a film was formed up to a predetermined film thickness with the rotation of the stage 2 stopped.

In Reference Example 2, while supplying the process gas at a constant flow rate, the temperature profile of the heater 21 was set to temperature profile 5 (Prof. 5) uniform in the circumferential direction, i.e., the ratio of the amount of supply of power to each region (the third region 103 to the sixth region 106) on the outer peripheral side was set to be uniform, and a film was formed up to a predetermined film thickness with the stage 2 rotated.

In Reference Example 3, while supplying the process gas at a constant flow rate, the heater 21 was arranged as shown in FIG. 12A, the temperature profile of the heater 21 was set to temperature profile 1 (Prof. 1), i.e., the ratio of the amount of supply of power to each region (the third region 103 to the sixth region 106) on the outer peripheral side was set to be different, and a film was formed up to a predetermined film thickness with the rotation of the stage 2 stopped.

Film formation conditions other than those described above were common to the present Example and Reference Examples 1, 2 and 3, a silane gas (SiH$_4$) as a precursor gas was supplied at a predetermined flow rate (100 sccm) together with an inert gas (an Ar gas), and a silicon film was formed at a predetermined temperature (560 degrees C.) and a predetermined pressure (9 to 10 Torr).

Figure 14A:
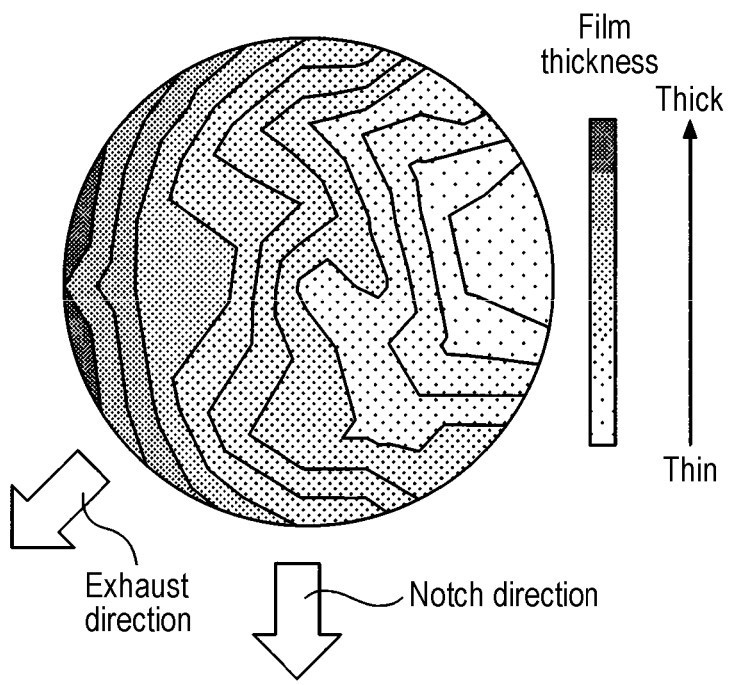
FIG. 14A is an example of a diagram showing film thickness distributions in the present Example and Reference Example.
Figure 14B:
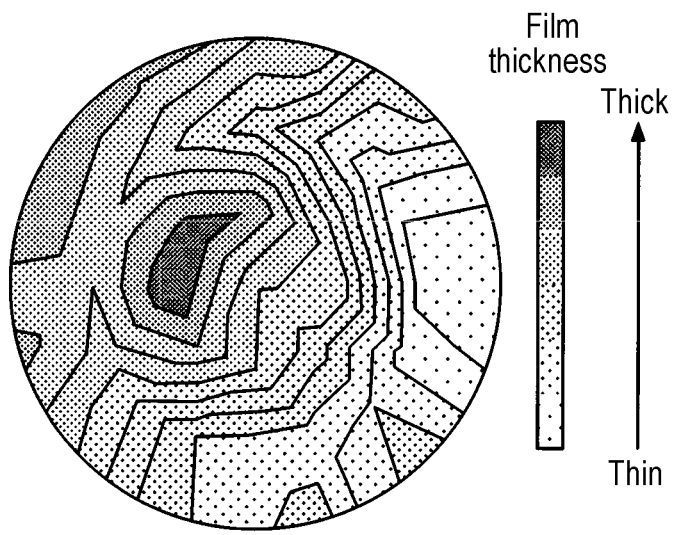
FIG. 14B is an example of a diagram showing film thickness distributions in the present Example and Reference Example.
Figure 14C:
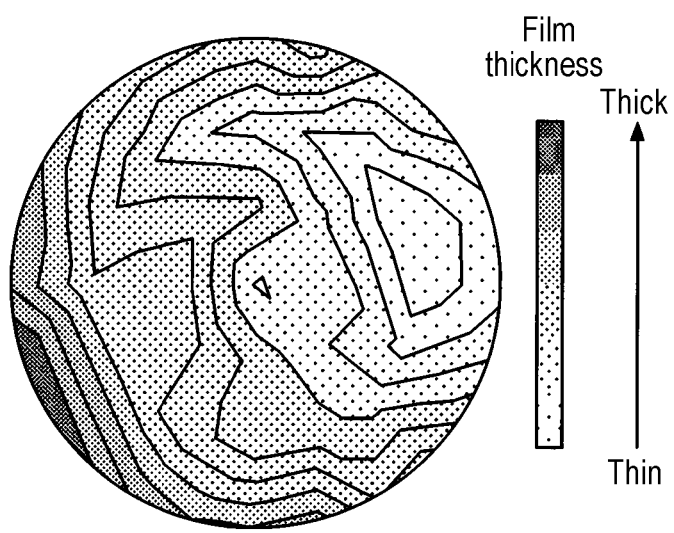
FIG. 14C is an example of a diagram showing film thickness distributions in the present Example and Reference Example.
Figure 14D:
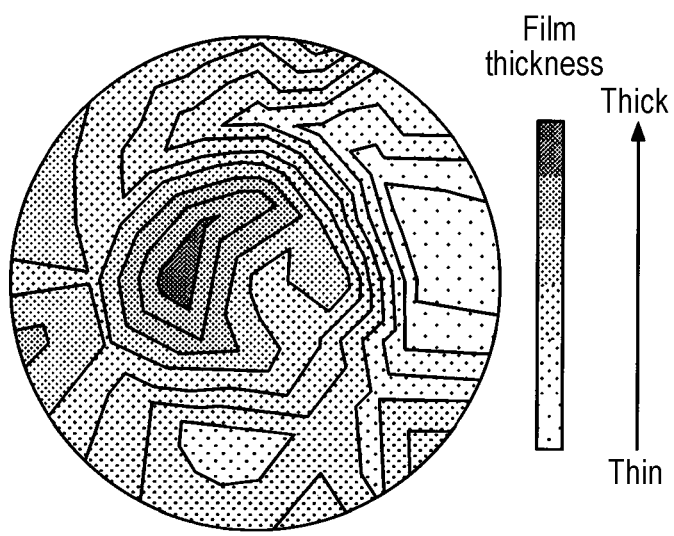
FIG. 14D is an example of a diagram showing film thickness distributions in the present Example and Reference Example.

FIGS. 14A to 14D are examples of diagrams showing film thickness distributions in the present Example and Reference Examples. In FIGS. 14A to 14D, the thicker the film, the denser the dots are hatched, and the thinner the film, the sparser the dots are hatched. FIG. 14A shows the film thickness distribution in Reference Example 1. FIG. 14B shows the film thickness distribution in Reference Example 2. FIG. 14C shows the film thickness distribution in Reference Example 3. FIG. 14D shows the film thickness distribution in the present Example. Further, an exhaust direction and a notch direction are common and are as indicated by white arrows shown in FIG. 14A. The wafer W is initially arranged so that a notch of the wafer W is located between the fourth region 104 and the fifth region 105 in FIG. 12A.

In Reference Example 1 shown in FIG. 14A, the in-plane distribution of the film thickness was 3.76% due to the non-uniformity of the gas and the non-uniformity of the temperature.

In Reference Example 2 shown in FIG. 14B, the uniformity of the gas was ensured by rotating the stage 2, and the in-plane distribution of the film thickness was 2.49%. However, due to the temperature non-uniformity, the film thickness on the left side is thicker and the film thickness on the right side is thinner.

In Reference Example 3 shown in FIG. 14C, the temperature uniformity was ensured by controlling the outer peripheral temperature of the heater 21, and the in-plane distribution of the film thickness was 2.80%. However, due to the deviation of gas flow in the exhaust direction, the film thickness in the exhaust direction is thicker and the film thickness in the opposite direction to the exhaust direction is thinner.

In contrast, in the present Example shown in FIG. 14D, the gas uniformity was ensured by rotating the stage 2, the temperature uniformity was ensured by controlling the outer peripheral temperature of the heater 21, and the in-plane distribution of the film thickness was 1.66%. Thus, it was confirmed that the in-plane distribution of the film thickness could be improved in the present Example as compared with Reference Examples 1 to 3.

Although the substrate treatment method using the substrate treatment device has been described above, the present disclosure is not limited to the above-described embodiments and the like, but various modifications and improvements can be made within the scope of the present disclosure described in the claims.

Although it has been described that the supply amount of the process gas supplied from the gas supply mechanism 5 into the processing space 38 in the process of processing the substrate W with the plurality of steps (S102 to S105, S202 to S205, S402 to S403, S406 to S407, and S502 to S509) is constant, the present disclosure is not limited thereto. In order to improve the in-plane uniformity of the processing of the substrate W, the supply amount of the process gas may be controlled for each step. Thereby, the deviation of the gas flow can be corrected, and the in-plane uniformity of the processing performed on the substrate W can be improved.

Although it has been described that the substrate treatment device performs the film forming process on the substrate W, the present disclosure is not limited thereto, and may be applied to a substrate treatment device that performs other processes. Further, the substrate treatment device may be a plasma CVD apparatus using plasma, a plasma ALD apparatus using plasma, or the like, or may be a thermal CVD apparatus, a thermal ALD apparatus, or the like.

This application is based upon and claims the benefit of priority from Japanese Patent Application No. 2020-175453, filed on Oct. 19, 2020, the entire contents of which are incorporated herein by reference.

EXPLANATION OF REFERENCE NUMERALS

1: process container, 2: stage, 3: shower head (gas supply part), 4: exhaust part, 5: gas supply mechanism (gas supply part), 9: controller, 21: heater (heating element), 23: support member, 24: elevating mechanism, 25: rotation mechanism, 26: heater power supply (heating element), W: substrate

What is claimed is:

1. A substrate treatment method of a substrate treatment device, which includes a stage on which a substrate is mounted, a heating element provided on the stage, and a rotation mechanism that rotates the stage, the substrate treatment method comprising:
   mounting the substrate on the stage; and
   performing a process on the substrate,
   wherein the heating element is divided into a plurality of temperature-controllable regions, wherein the performing the process on the substrate has a plurality of steps, and wherein each of the plurality of steps includes controlling the heating element by simultaneously supplying power to at least two regions of the plurality of temperature-controllable regions and controlling the rotation mechanism.

2. The substrate treatment method of claim 1, wherein the plurality of temperature-controllable regions is divided in a circumferential direction of the stage, and wherein the controlling the heating element includes controlling a temperature of the regions and controlling a temperature of an outer periphery of the substrate.

3. The substrate treatment method of claim 2, wherein the controlling the heating element is performed based on a preset table.

4. The substrate treatment method of claim 3, wherein the preset table has a plurality of temperature profiles, and wherein the controlling the heating element includes independently controlling the plurality of regions based on the plurality of temperature profiles.

5. The substrate treatment method of claim 4, wherein the performing the process on the substrate includes:

a first step of controlling the heating element based on a first temperature profile to perform the process on the substrate while rotating the stage; and a second step of controlling the heating element based on a second temperature profile different from the first temperature profile to perform the process on the substrate while rotating the stage.

6. The substrate treatment method of claim 5, wherein the performing the process on the substrate further includes stopping the rotation of the stage and performing the process on the substrate.

7. The substrate treatment method of claim 6, wherein the performing the process on the substrate includes repeating the first step and the second step a plural number of times.

8. The substrate treatment method of claim 7, wherein the performing the process on the substrate includes a film-forming step, and wherein the film-forming step includes:

supplying a precursor gas to a processing space of the substrate while rotating the stage and controlling the heating element based on the first temperature profile;

purging an inside of the processing space while rotating the stage and controlling the heating element based on the first temperature profile;

supplying a reaction gas to the processing space while rotating the stage and controlling the heating element based on the second temperature profile; and purging the inside of the processing space while rotating the stage and controlling the heating element based on the second temperature profile.

9. The substrate treatment method of claim 8, wherein the performing the process on the substrate further includes an etching step, and wherein the etching step includes:

performing the process on the substrate while rotating the stage and controlling the heating element based on a third temperature profile different from the first temperature profile and the second temperature profile.

10. The substrate treatment method of claim 9, wherein the controlling the rotation mechanism includes controlling at least one of rotation, stop, rotation direction or rotation speed of the stage.

11. The substrate treatment method of claim 1, wherein the controlling the rotation mechanism includes controlling at least one of rotation, stop, rotation direction or rotation speed of the stage.

12. A substrate treatment device comprising:

a stage on which a substrate is mounted;

a heating element provided on the stage and divided into a plurality of temperature-controllable regions;

a rotation mechanism configured to rotate the stage; and a controller, wherein a process performed by the controller includes:

mounting the substrate on the stage; and performing a process on the substrate, wherein the performing the process on the substrate has a plurality of steps, and wherein each of the plurality of steps includes controlling the heating element by simultaneously supplying power to at least two regions of the plurality of temperature-controllable regions and controlling the rotation mechanism.

* * * * *